United States Patent [19]

Hirose

[11] Patent Number: 5,740,468

[45] Date of Patent: Apr. 14, 1998

[54] DATA TRANSFERRING BUFFER

[75] Inventor: Fumiyasu Hirose, Machida, Japan

[73] Assignee: Fujitsu Limited, Kawasaki, Japan

[21] Appl. No.: 159,705

[22] Filed: Dec. 1, 1993

Related U.S. Application Data

[63] Continuation of Ser. No. 563,941, Aug. 6, 1990, abandoned, which is a continuation of Ser. No. 142,948, Jan. 12, 1988, abandoned.

[30] Foreign Application Priority Data

| Jan. 12, 1987 | [JP] | Japan | 62-004522 |
| Jan. 12, 1987 | [JP] | Japan | 62-004523 |

[51] Int. Cl.⁶ ......................................... G06F 13/12
[52] U.S. Cl. .................. 395/877; 395/877; 395/200.02
[58] Field of Search ...................... 364/DIG. 1, DIG. 2; 395/200, 250, 275, 325, 800, 200.13, 200.01, 200.02, 877, 311; 370/16; 340/825.5, 825.51, 825.06, 825.15

[56] References Cited

U.S. PATENT DOCUMENTS

| H62 | 5/1986 | Sanderson | 375/58 |
|---|---|---|---|
| 3,936,600 | 2/1976 | Galbraith | 178/17.5 |
| 4,114,750 | 9/1978 | Baeck et al. | 400/279 |
| 4,169,991 | 10/1979 | Ross | 318/599 |
| 4,204,779 | 5/1980 | Lee et al. | 400/144.2 |
| 4,325,120 | 4/1982 | Colley et al. | 364/200 |
| 4,381,553 | 4/1983 | Ferguson | 395/775 |
| 4,396,307 | 8/1983 | Shah et al. | 400/625 |
| 4,455,645 | 6/1984 | Mijioka et al. | 370/16 |
| 4,467,411 | 8/1984 | Fry et al. | 395/250 |
| 4,480,541 | 11/1984 | Grummett | 101/93.04 |
| 4,511,928 | 4/1985 | Colomb | 358/468 |
| 4,514,807 | 4/1985 | Nogi | 364/200 |
| 4,516,201 | 5/1985 | Warren et al. | 364/200 |
| 4,602,341 | 7/1986 | Gordon et al. | 364/494 |
| 4,611,322 | 9/1986 | Larson et al. | 370/60 |
| 4,616,337 | 10/1986 | Sheth | 395/275 |
| 4,623,996 | 11/1986 | McMillen | 370/60 |
| 4,646,061 | 2/1987 | Bledsoe | 340/347 DD |
| 4,722,085 | 1/1988 | Flora et al. | 371/38 |
| 4,729,020 | 3/1988 | Schaphorst et al. | 348/419 |
| 4,797,951 | 1/1989 | Duxbury et al. | 455/608 |
| 4,814,970 | 3/1989 | Barbagelata et al. | 395/200 |
| 4,829,421 | 5/1989 | Ritchie | 395/250 |
| 5,060,140 | 10/1991 | Brown et al. | 364/200 |
| 5,326,181 | 7/1994 | Eisner et al. | 400/104 |

FOREIGN PATENT DOCUMENTS 57-62432  1/1980  Japan .

OTHER PUBLICATIONS

Akiyama, Minoru, "Modern Communication Exchange Engineering", Denki Shoin, 1973, p. 66.

"Nikkei Electronics", Nihon Keizai Shinbunsha, Dec. 21, 1981, pp. 88–108.

Michel Dubois, Christoph Scheurich, Faye Briggs, "Memory Access Buffering in Multiprocessors", 1986 IEEE, pp. 434–442.

(List continued on next page.)

Primary Examiner—Thomas G. Black
Assistant Examiner—M. N. Von Buhr
Attorney, Agent, or Firm—Staas & Halsey

[57] ABSTRACT

Data transferring buffer circuits for data exchange include a plurality of buffers corresponding to a plurality of data sources for independently receiving and storing data sent from the plurality of data sources, and a buffer limit signal generating circuit for delivering a buffer limit signal when the amount of data stored in a buffer reaches a predetermined limit. The buffer circuits also include a data read signal generating circuit for selecting one of the buffers and generating a data reading signal for the selected buffer. The data reading signal is generated based on a remaining amount of data and information concerning a vacancy at a buffer to which data is to be supplied. The buffer circuits also include a selected data delivery circuit for adopting data selected by the data read signal generating circuit and for delivering the adopted data.

10 Claims, 16 Drawing Sheets

OTHER PUBLICATIONS

Nobuhiko Koike, Kenji Ohmori, Tohru Sasaki, "HAL: A High-Speed Logic Simulation Machine", 8219 IEEE Design & Test of Computers 2 (1985) Oct. No. 5, New York USA, pp. 61–73.

M. Soegaard–Knudsen, M.Sc., "Hierarchical specification and switch–level simulation of digital circuits", IEE Proceedings, vol. 132, Pts. E and I. No. 2, Mar. Apr. 1985, pp. 102–107.

"Scientific computer simulates VLSI circuits in record time", Electronic Design, Mar. 7, 1985, pp. 153–159.

European Search Report conduct by Examiner Soler J.M.B. and completed Feb. 15, 1991 at the Hague.

EVENT TRANSMISSION NETWORK

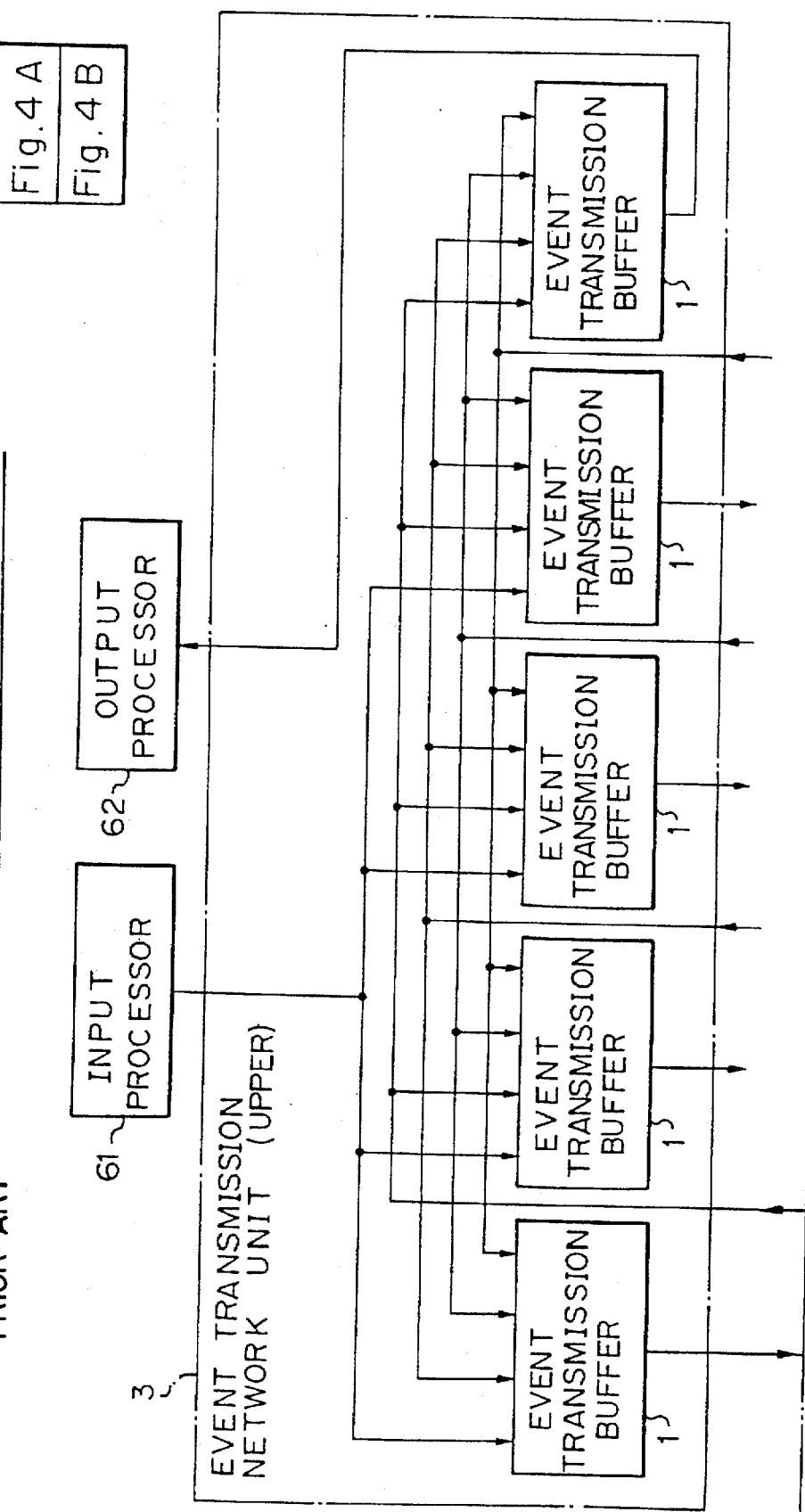

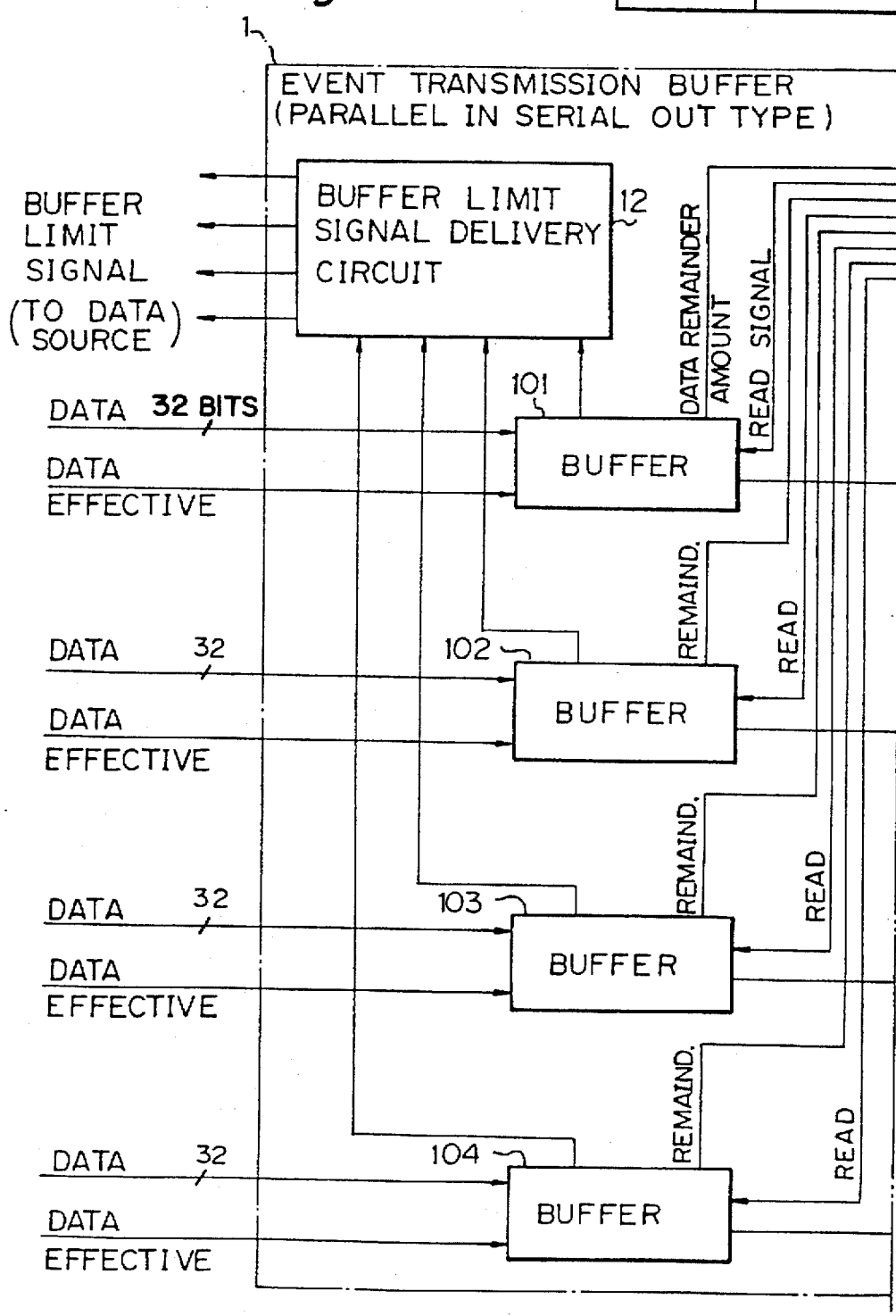

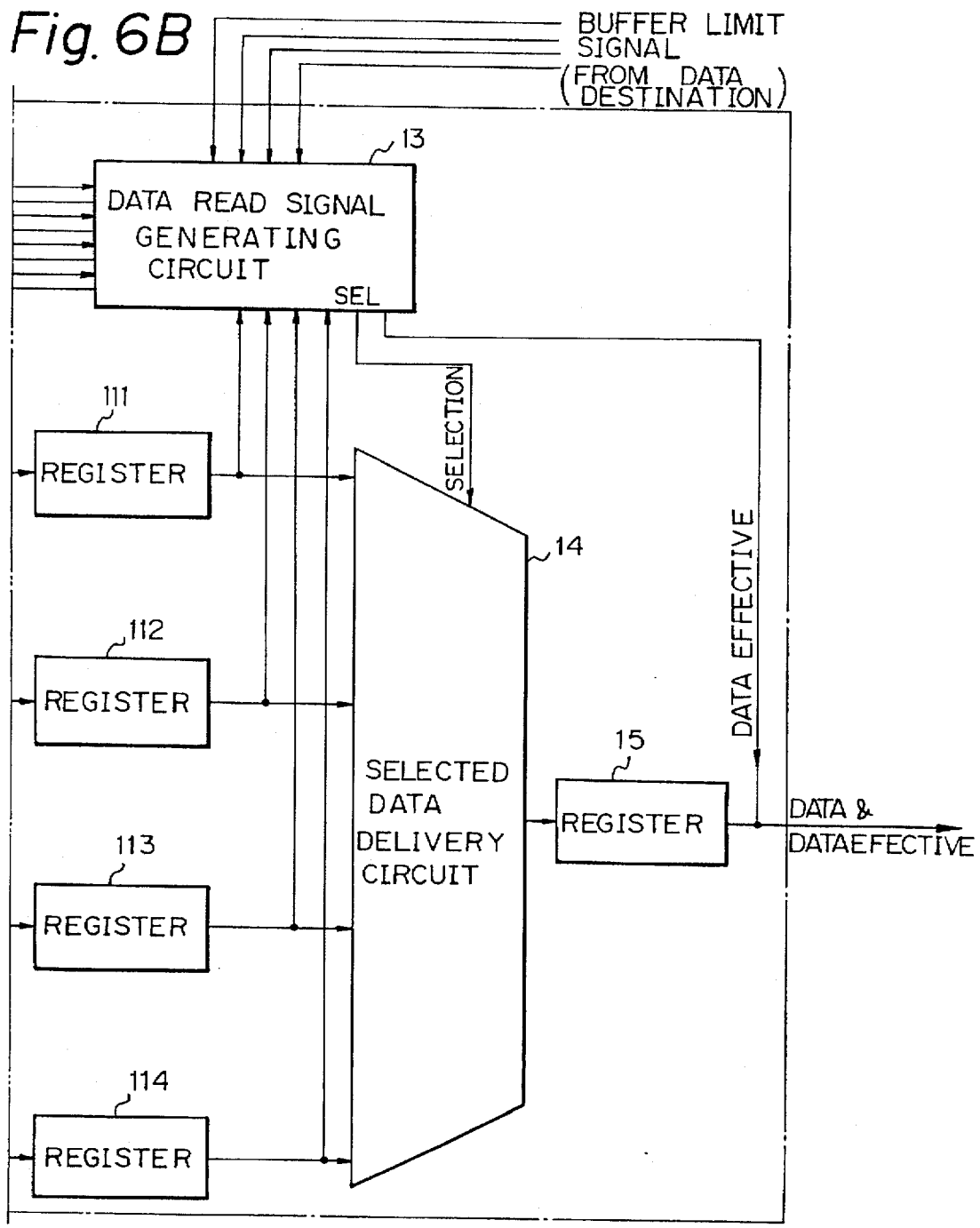

Fig. 13

| NUMBER (N) OF PROCESSORS | NUMBER (A) OF SWITCHING MODULES IN DEVICE OF Fig.10 | NUMBER (B) OF SWITCHING MODULES IN DEVICE OF Fig.12 | RATIO ($\frac{A}{B}$) IN % |
|---|---|---|---|
| 4 | 1 | 1 | 100 |
| 16 | 5 | 8 | 62.5 |
| 64 | 21 | 48 | 43.8 |
| 256 | 85 | 256 | 33.2 |
| 1 K | 341 | 1280 | 26.6 |
| 4 K | 1365 | 6 K | 22.2 |
| 16 K | 5461 | 28 K | 19.0 |
| 64 K | 21845 | 128 K | 17.0 |
| 256 K | 87381 | 576 K | 14.8 |
| 1 M | 349525 | 2560 K | 13.3 |

Fig.10 DEVICE : $A = \frac{1}{3}(N-1)$

Fig.12 DEVICE : $B = \frac{1}{4} \cdot N \cdot \log_4 N$ (N IS REPRESENTED AS $N = 4^n$)

DATA TRANSFERRING BUFFER

This application is a continuation of application Ser. No. 07/563,941, filed Aug. 6, 1990, now abandoned, which is a continuation of application Ser. No. 07/142,948, filed Jan. 12, 1988, now abandoned.

BACKGROUND OF THE INVENTION

1. Field of the Invention

The present invention relates to data transferring buffer circuits for data exchange and a system of data transmission between processors using the data transferring buffer circuits. The data transferring buffer circuits according to the present invention can be used in a system of a simulation processor (SP).

2. Description of the Related Art

In data processing by a great number of processors with a transmission network for interconnecting the processors to allot divisions of processing and carry out the divisions of the processing in parallel, it is necessary to transfer data between the processors as quickly as possible.

In general, in order to transfer data from a plurality of data sources to a plurality of data destinations, the data sources and the data destinations are directly connected through a switching unit. In this case, when a plurality of calls occur simultaneously for the same data destination, all data sources except one are placed in a waiting state. Under such a situation, it is necessary to control the timing of data delivery from the data source in question according to the data transfer requests from other data sources.

In order to simplify this control of data delivery timing, it is possible to provide input buffers and output buffers having sufficient storage capacity to store the data to be transferred where simultaneous plural calls for the same data destination occur. However, in such a case, there is a disadvantage in that a great number of buffers are needed. The disadvantage is greater when the buffers are used for multi-stage data exchanging circuits.

SUMMARY OF THE INVENTION

It is an object of the present invention to provide improved data transferring buffer circuits for data exchange enabling data transfer between a great number of processors by a relatively small number of buffers with relatively simple control processes.

It is another object of the present invention to provide an improved system of data transfer between a great number of processors using data transferring buffer circuits for data exchange suitable for data transfer between processors by a relatively small number of buffers with relatively simple control processes.

It is still another object of the present invention to provide an improved system of data transfer between a plurality of processors by using a plurality of event transmission buffers.

The construction of the system is relatively easy, since the system can be constructed by simply connecting event transmission buffers having relatively simple structures.

In accordance with an aspect of the present invention, there is provided data transferring buffer circuits for data exchange where data is supplied from a plurality of data sources to a plurality of data destinations. The buffer circuits include a plurality of buffers corresponding to the plurality of data source, independently receiving and storing data sent from the plurality of data sources; a buffer limit signal generating circuit for delivering a buffer limit signal when the amount of data stored in the buffer reaches a predetermined limit; a data read signal generating circuit for selecting one of the buffers and generating a data reading signal for the selected buffer based on the remaining data amount and information concerning the vacancy of the buffer to which data is to be supplied; and a selected data delivery circuit for adopting data selected by the data read signal generating circuit and delivering the adopted data.

In accordance with another aspect of the present invention, there is provided a system of data transfer between a plurality of processors in which data processing is carried out by exchanging data between a plurality of processors, the system including groups of processors arranged in a hierarchy, each of the groups of processors comprising a data exchange unit for interconnecting the processors therethrough. The data exchange unit includes a data input portion for receiving data independently from processors belonging to the same group or lower data exchange unit and from an upper data exchange unit, a data holding portion for holding received data until the delivery of the received data when a plurality of data exchange request signals exists, and a selective data delivery portion for selectively delivering the received data to processors belonging to the same group or lower data exchange unit and to one of the data exchange units of upper processor groups.

BRIEF DESCRIPTION OF THE DRAWINGS

FIGS. 4A and 4B show another example of a prior art event transmission network;

FIGS. 6A and 6B show an event transmission buffer according to an embodiment of the present invention;

FIG. 13 shows a table representing the reduction of the number of switching modules in the device of FIG. 10.

DESCRIPTION OF THE PREFERRED EMBODIMENTS

Before describing the preferred embodiments of the present invention, prior art data transfers between data sources and data destinations through a switching unit, and systems to which the present invention is to be applied, are described with reference to prior art FIGS. 1A, 1B, 2, 3, 4B, 4B, and 5.

Figure 1A:
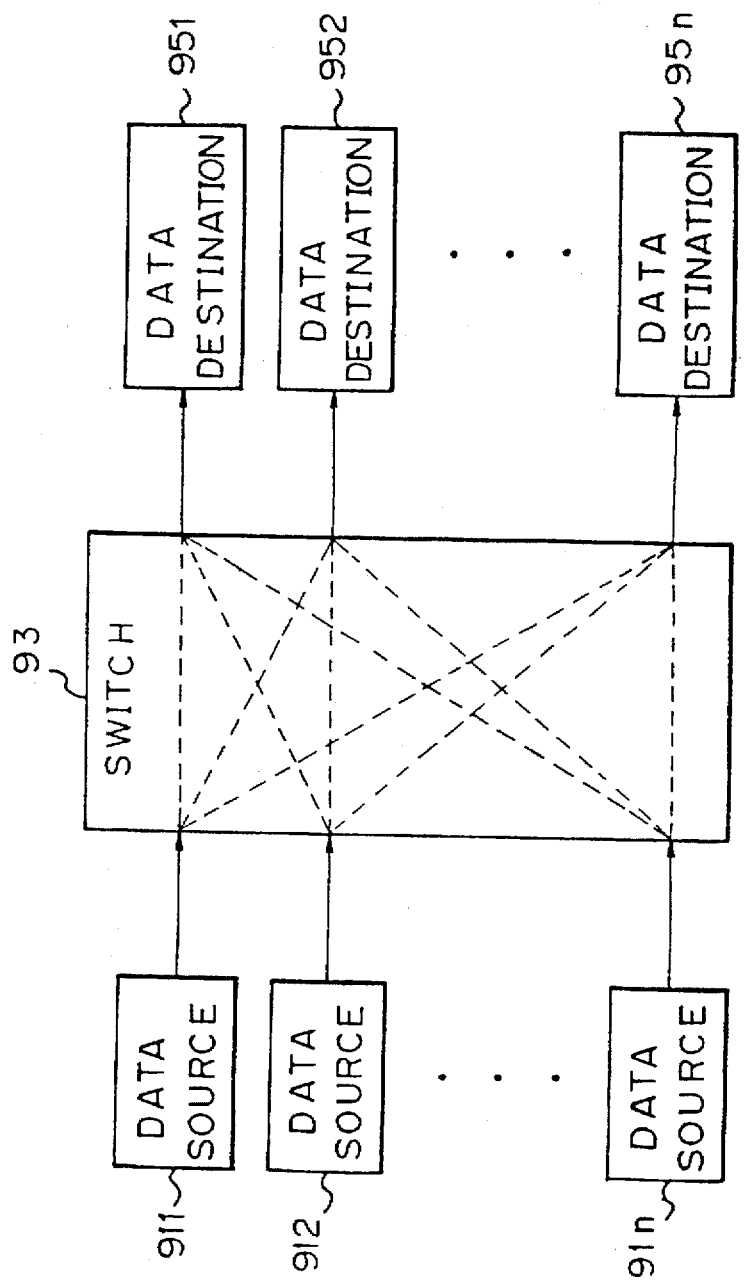
FIGS. 1A and 1B show prior art data transfer between data sources and data destinations through a switching unit.

The prior art data transfer system shown in FIG. 1A is constituted of a plurality of data sources 911, 912, ... 91n, a plurality of data destinations 951, 952, ... 95n, and a switching unit 93. In the system of FIG. 1A, when a plurality of calls occur from the data source side for the same data destination, all except one are placed in a waiting state. Under such a situation, it is necessary to control the timing of data delivery from the data source in question according to the data transfer requests from other data sources.

Figure 1B:
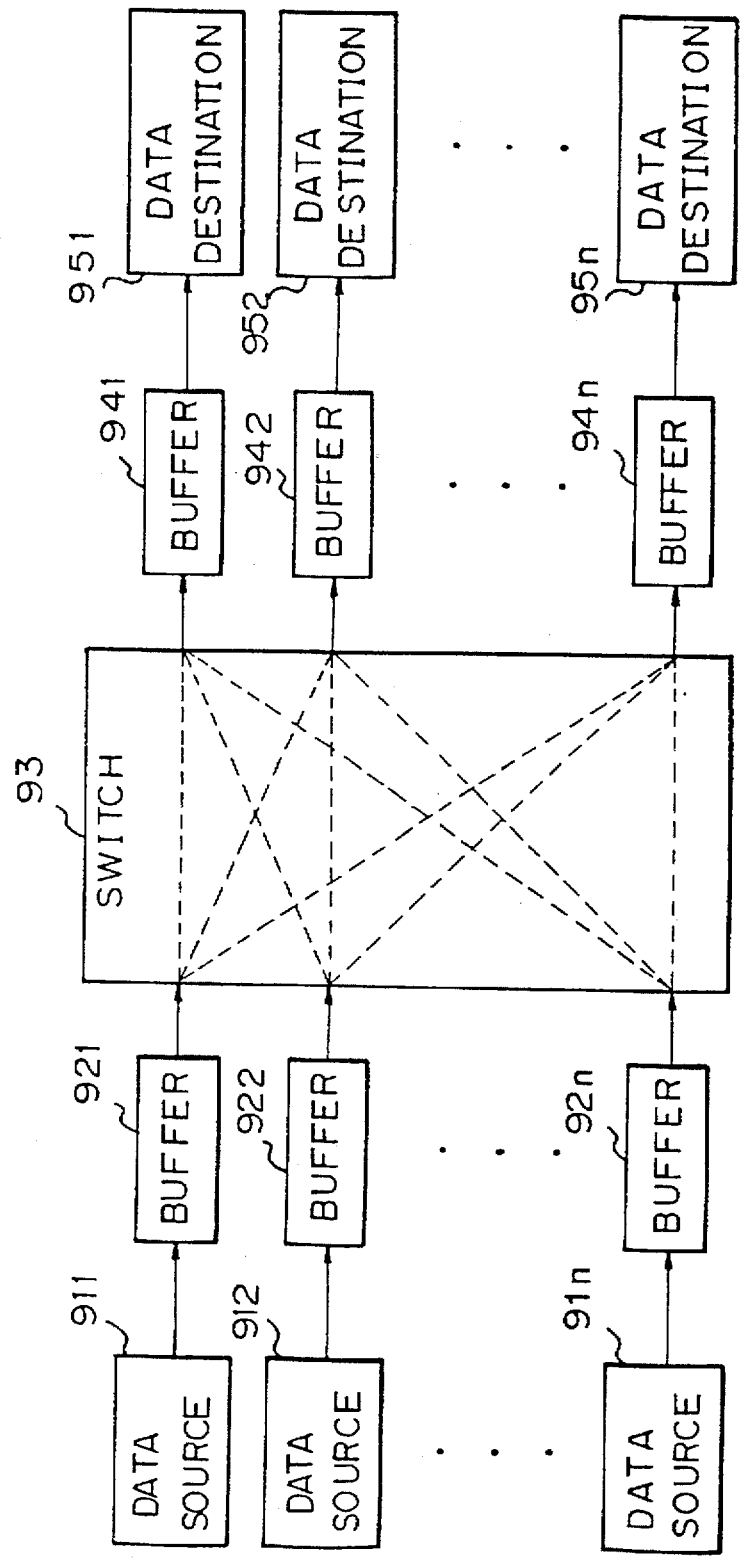

Another prior art data transfer system shown in FIG. 1B is constituted of a plurality of data sources 911, 912, ... 91n, a plurality of input buffers 921, 922, ... 92n, a switching unit 93, a plurality of output buffers 941, 942, ... 94n, and a plurality of data destinations 951, 952, ... 95n. Each of the input and output buffers has sufficient storage capacity to store the data to be transferred where simultaneous, plural calls occur for the same data destination.

Figure 2:
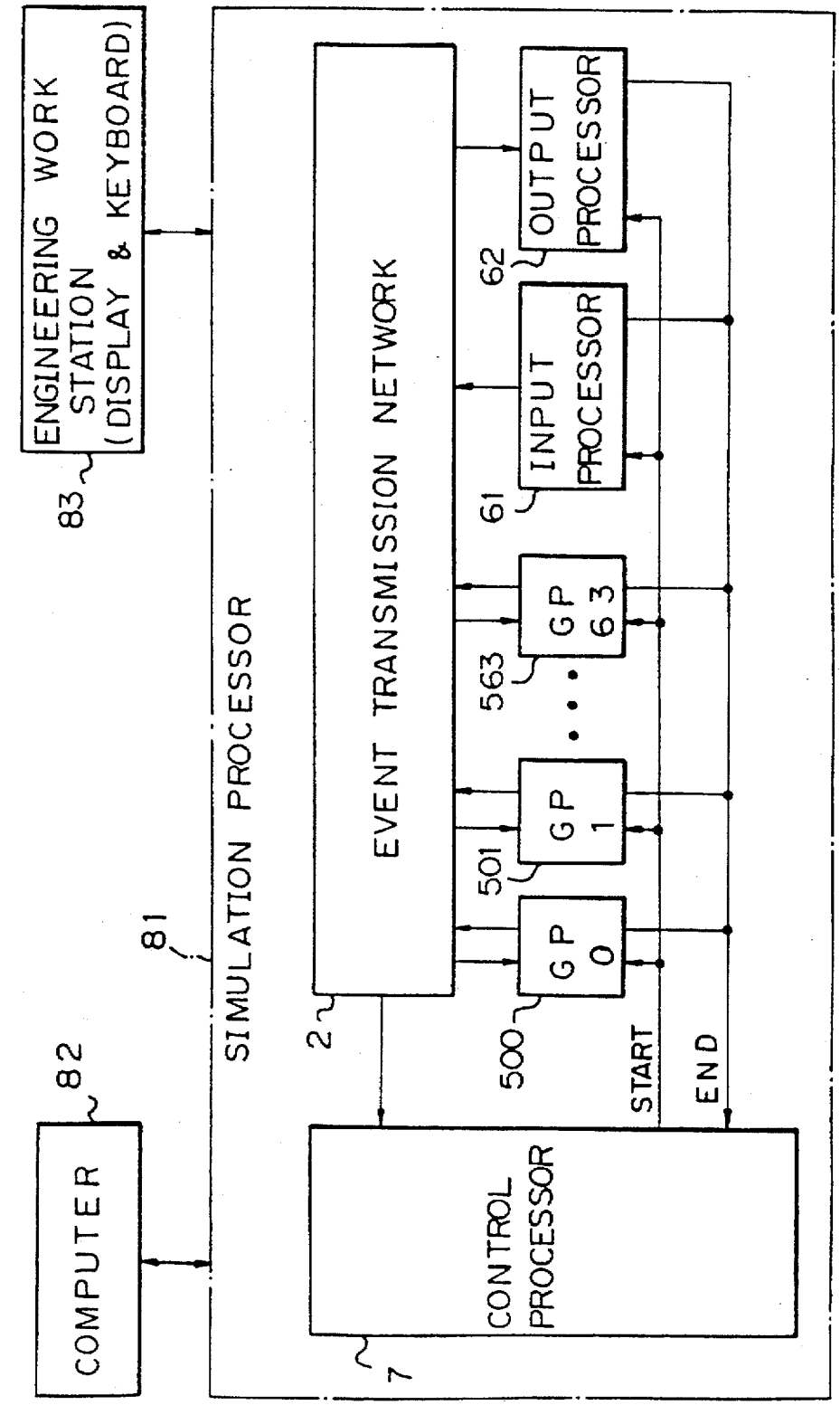
FIG. 2 shows a prior art system using a simulation processor to which the data transferring buffer circuits for data exchange according to the present invention can be applied.

A simulation processor system used for logic verification of very large scale integrated circuits (VLSI's) before production is shown in FIG. 2. The system of FIG. 2 is constituted of a computer 82, a simulation processor 81, and an engineering work station (display and keyboard) 83. The simulation processor 81 is constituted of a control processor 7, an event transmission network 2, gate processors (GP) 500, 501, ... 563, an input processor 61, and an output processor 62.

For example, the multiple gate processors 501 to 563 simulate partitioned subcircuits with a maximum capacity of 64K primitives and a 512Kbyte memory at a maximum speed of 12.8M active primitive evaluations per second. The input processor 61 sends external input patterns to the gate processors during simulation. The output processor 62 receives the events from the monitored processors, storing up to 4M events. The event transmission network 2 handles the interprocessor communication.

Figure 3:
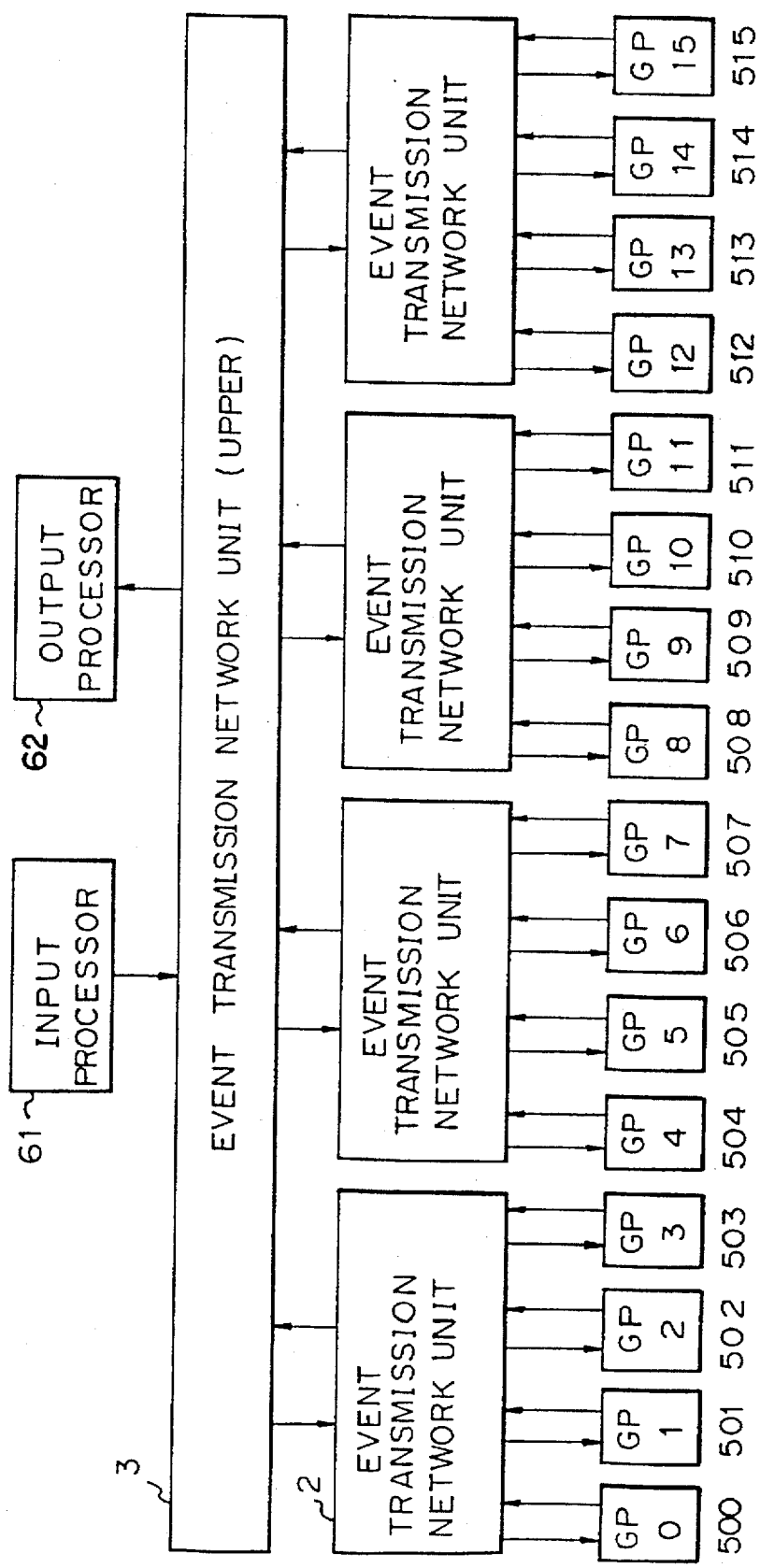
FIG. 3 shows an example of a prior art event transmission network which can be used in the system of FIG. 2.

An example of the event transmission network (ET) used for the system of FIG. 2 is shown in FIG. 3. The event transmission network of FIG. 3 is for 16 gate processors (GP) 500 to 515, and is divided into event transmission network units (ETU) which exchange events among four gate processors, or four event transmission network units one level lower in the hierarchy, and one event transmission network unit, or a pair of an input processor and an output processor, one level higher in the hierarchy. Event transmission network units are designed such that each gate processor can send and receive one event independently in each clock cycle.

Figure 4B:
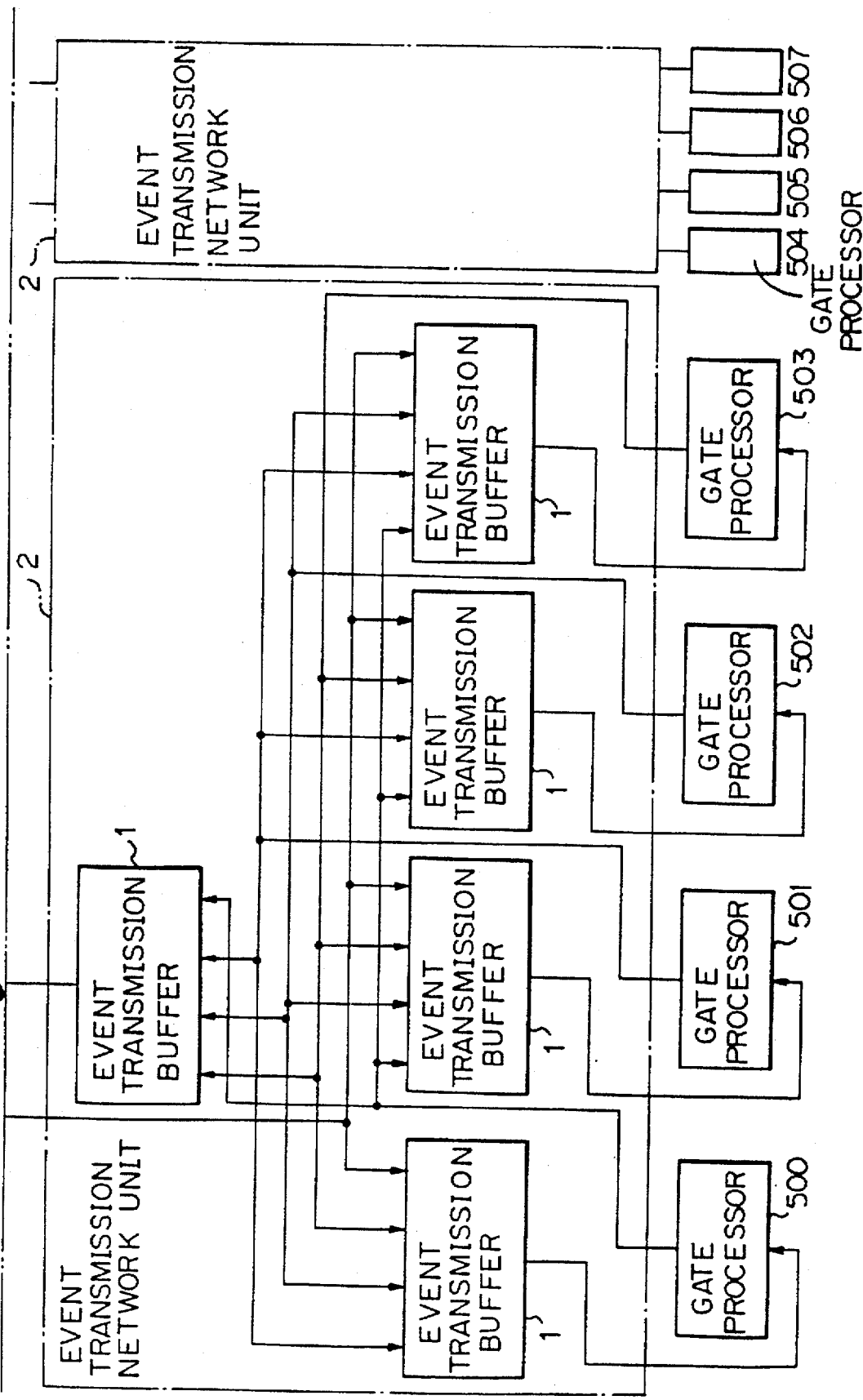

The detailed structure of the event transmission network is shown in FIGS. 4A and 4B. Each of the event transmission buffers 1 independently receives four events every clock cycle and sends one event taken from the buffer that is closest to the storage limit. An event transmission network unit includes five event transmission buffers.

In the device of FIG. 3, there are three types of event transmission paths: from GP0 (500), via an event transmission network unit, to GP1 (501); from GP1 (501), via an event transmission network unit, the upper event transmission network unit 3, and another event transmission network unit, to GP12 (512); and from GP12 (512), via an event transmission network unit 2 and the upper event transmission network unit 3 to output processor 63. In every clock cycle, events are transmitted in all paths in the form of pipeline processing.

Figure 5:
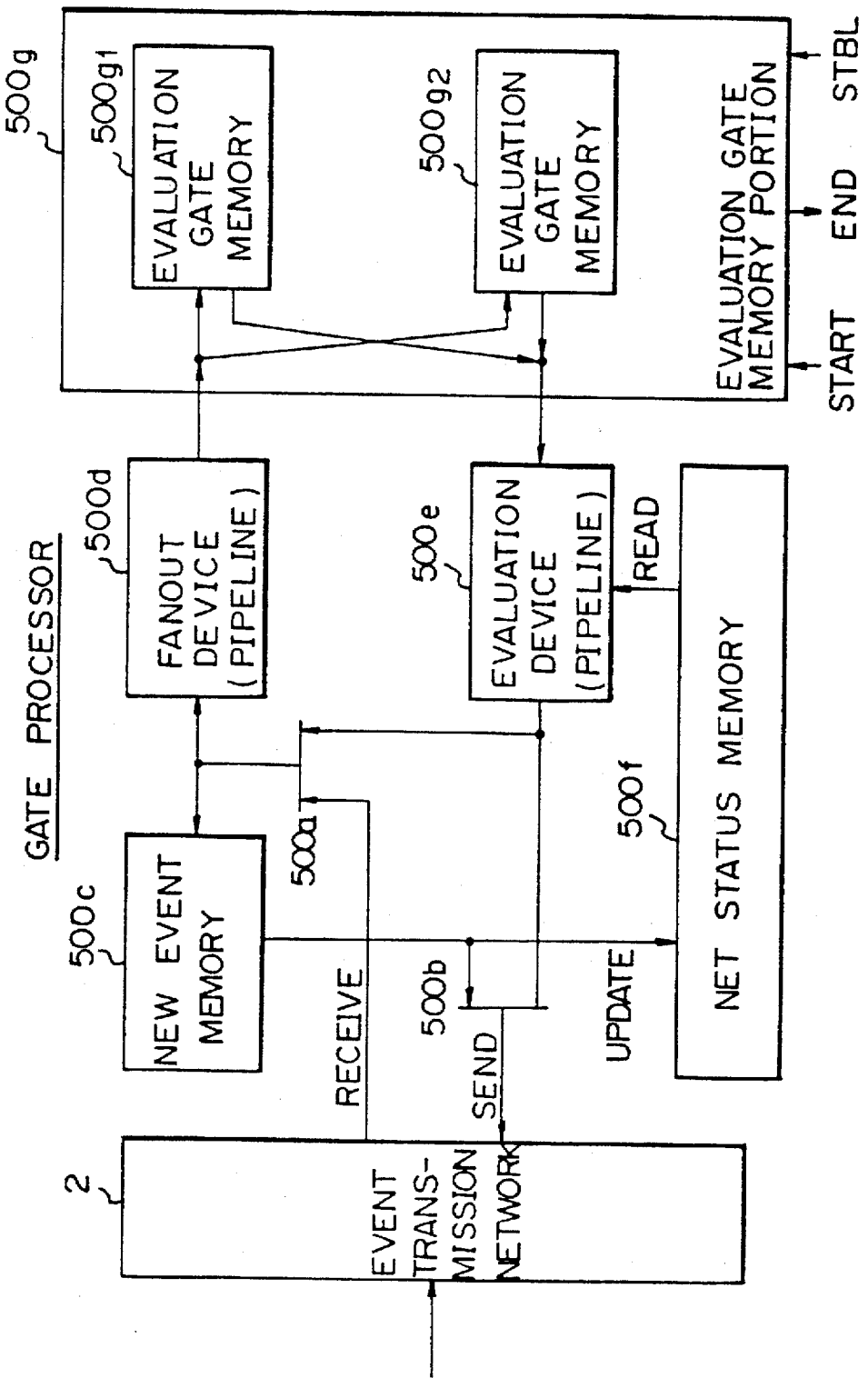
FIG. 5 shows a prior art structure of the gate processor used in the simulation processor shown in FIG. 2.

The structure of a gate processor with an event transmission network used in the system of FIG. 2 is shown in FIG. 5. The device of FIG. 5 is constituted of an event transmission network 2, OR gates 500a and 500b, new event memory 500c, fanout device 500d, evaluation device 500e, net status memory 500f, and evaluation gate memory portion 500g including evaluation gate memories $500g_1$, and $500g_2$.

In the device of FIG. 5, first, the input processor (61, FIG. 3) sends external events through an event transmission network 2 to the gate processor of FIG. 5. When the gate processor receives an event from the event transmission network 2, the gate processor stores the received event in the new event memory 500c and begins to send fanouts through the fanout pipeline 500d. If not yet registered, a fanout primitive is stored in one of the evaluation gate memories $500g_1$, and $500g_2$. When the input processor and the event transmission network finish sending events, the input processor and the event transmission network notify the control processor (7, FIG. 2) with an end signal. The control processor increments unit time by 1 and a start command is issued for a simulation for unit time 1. In response to the start command, the gate processor begins to update the net status memory 500f using the new event memory 500c. If the gate processor has a user-defined probing flag, the event is also sent to the output processor (62, FIG. 3).

When the updating and fanout fetching are completed, the connections of the evaluation gate memories $500g_1$ and $500g_2$ to the fanout device 500d and the evaluation device 500f are switched. The evaluation device 500e first extracts the boundary primitives from the evaluation gate memory $500g_2$. Events in boundary nets trigger interprocessor transmission, and then an evaluation for internal primitives is started. The transmission and evaluation are carried out in parallel so that the transmission overhead is minimized. When the evaluation device 500e detects a next event, the evaluation device 500e registers the same in the new event memory 500c, supplies the same to the fanout device 500d, and sends the same to the event transmission network 2, if necessary. Then, the fanout device 500d begins to fetch fanout primitives for unit time 2, which are stored in the evaluation gate memory $500g_1$. During an evaluation, a gate processor can receive an event from the event transmission network only when the evaluation device 500e does not access the new event memory 500c. When all gate processors complete evaluation and the event transmission network completes event transmission, the gate processors notify the control processor by an end signal to start the unit time 2 simulation.

An event transmission buffer according to an embodiment of the present invention is shown in FIGS. 6A and 6B.

The device of FIGS. 6A and 6B is constituted of buffers 101, 102, 103, and 104, registers 111, 112, 113, and 114, a buffer limit signal delivery circuit 12, a data read signal generating circuit 13, a selected data delivery circuit 14, and a register 15.

Each of the buffers 101 to 104 receives data of 32 bits and a data effective signal of 1 bit from a source of data, a read signal from the data read signal generating circuit 13, and delivers data to a register 111–114, a buffer limit signal to the buffer limit signal delivery circuit 12, and a data remainder amount signal to the data read signal generating circuit 13. The selected data delivery circuit 14, in the form of a multiplexer, receives data from the registers 111, 112, 113, and 114 and delivers selected data in accordance with a selection signal from the data read signal generating circuit 13. The buffer limit signal delivery circuit 12 receives buffer limit signals from the buffers 101 to 104 and delivers buffer limit signals to the data source. The data read signal generating circuit 13, as a selection determination portion, receives data from the registers 111 to 114, a data effective signal from the register 15, data remainder amount signals from the buffers 101 to 104, and buffer limit signals from a destination of data and delivers read signals to the buffers 101 to 104 and a selection signal to the selected data delivery circuit 14.

Each of the buffers 101 to 104 is provided in correspondence to a data source. Each of the buffers 101 to 104 is constituted of a first-in-first-out (FIFO) memory. When the amount of data stored in a buffer reaches a predetermined limit value, a buffer limit signal is delivered through the buffer limit signal delivery circuit 12.

The data read signal generating circuit 13, as a selection determination portion, selects one of the buffers 101 to 104 based on the data remainder amount signals from the buffers 101 to 104 and the buffer limit signals from the data destination, delivers read signals to the buffers 101 to 104, and delivers a selection signal to the selected data delivery circuit 14.

The data selected in the selected data delivery circuit 14 based on the selection signal from the data read signal generating circuit 13 is delivered as output data through the register 15. A data effective signal is attached to this output data for designating the data destination.

Figure 7:
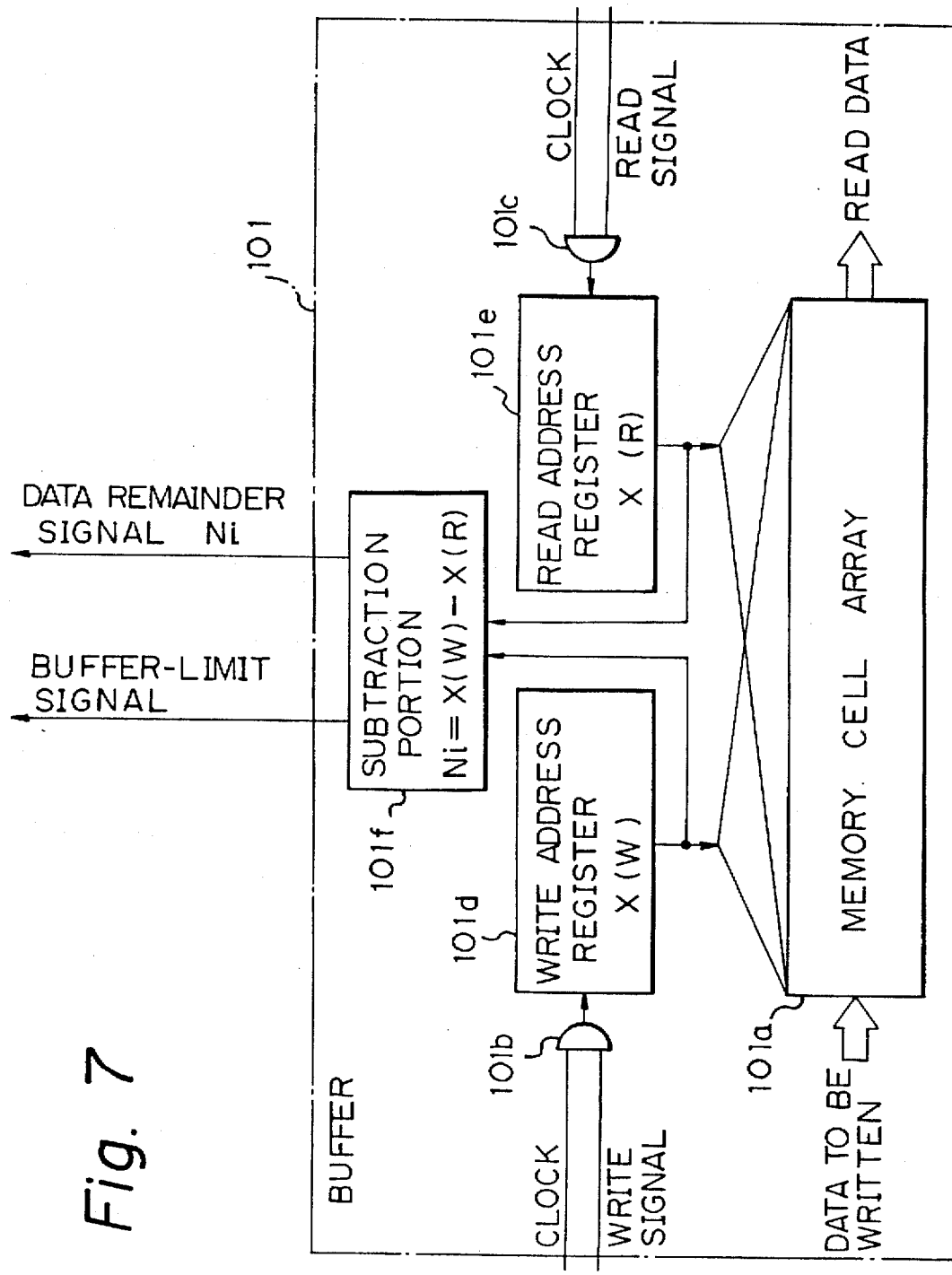
FIG. 7 shows the structure of the buffer in the event transmission buffer shown in FIGS. 6A and 6B.

The structure of the buffer in the event transmission buffer of FIG. 6A is shown in FIG. 7. The buffer 101 of FIG. 7 is constituted of a memory cell array 101a, AND gates 101b and 101c, a write address register 101d, a read address register 101e, and a subtraction portion 101f. Data is written into an address of the memory cell array 101a designated by the write address register 101d. The count of the write address register 101d is counted up by the write signal generated based on the data effective signal. Data is read from an address of the memory cell array 101a designated by the read address register 101e. The count of the read address register 101e is counted up by the read signal generated by the data read signal generating circuit 13 (FIG. 6).

The subtraction portion 101f calculates the difference Ni=X(W)−X(R) of the count X(W) of the write address register 101d and the read address register 101e. The difference Ni is transmitted to the data read signal generating circuit 13 as a data remainder amount signal.

The data remainder amount signal (Ni) may be a signal actually indicating the number of the remaining words of data. However, it is possible, for example, to use the upper j bits of an address for calculation, calculate the data amount based on a sampling with respect to 2 to the j-th power as a compression of data, add one line as an indication of vacancy, and accordingly, reduce the number of signal lines.

For example, assuming the depth of a buffer is 2K words, 11 bits are necessary to represent the remainder number. However, where j=2, 0 to 0.5K words is represented by "00", 0.5~1K words is represented by "01", 1~1.5K words is represented by "10", 1.5~2K words is represented by "11", another line is added for representing vacancy, and, if necessary, a further line is added for representing a buffer-limit. By this arrangement, the signal transmission path can be constituted by four lines per one buffer. Also, it is possible to produce a buffer-limit signal from the subtraction portion 101f.

Figure 8:
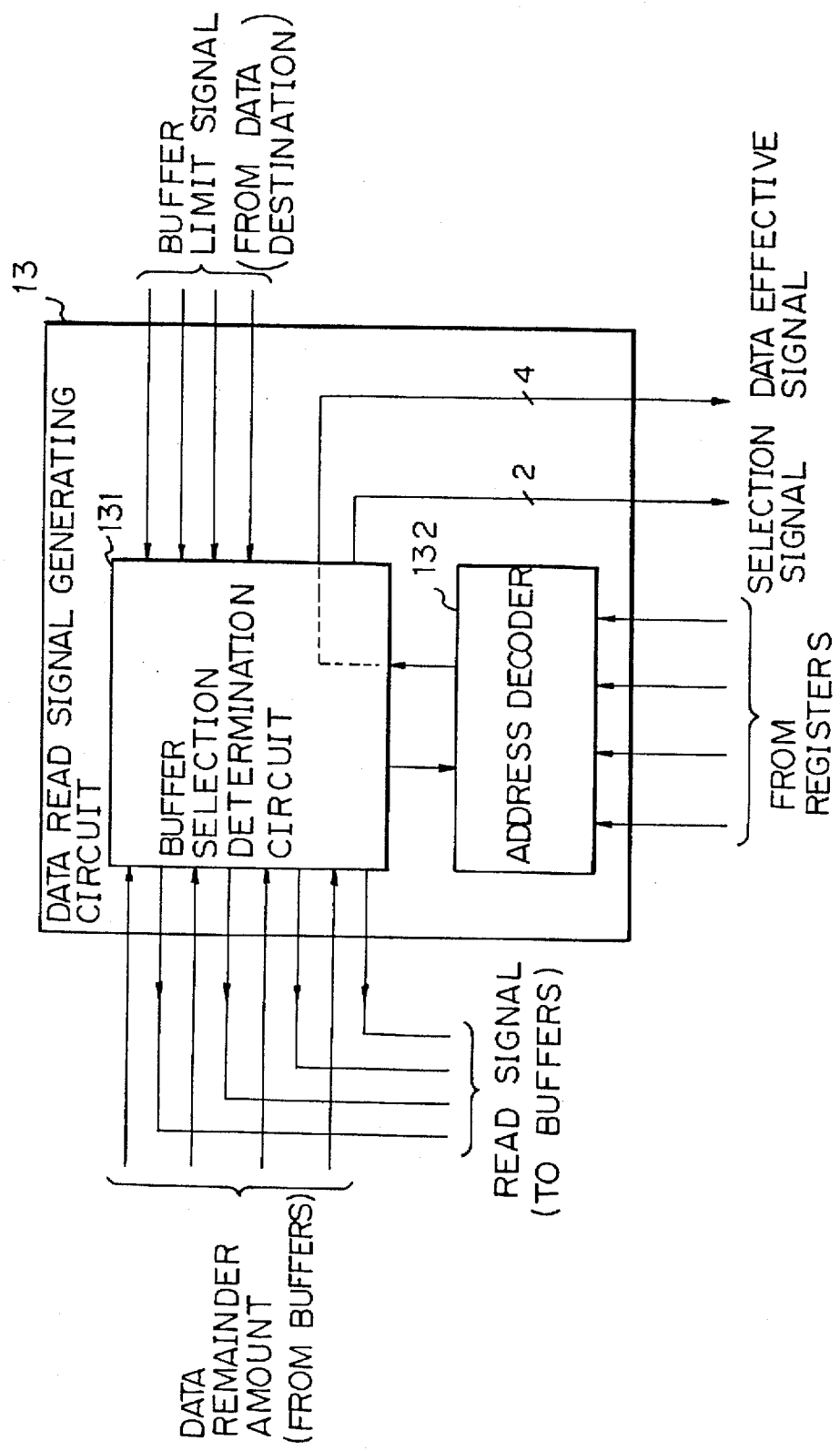
FIG. 8 shows the structure of the data read signal generating circuit in the event transmission buffer shown in FIGS. 6A and 6B.

The structure of the data read signal generating circuit 13 in the device of FIG. 6B is shown in FIG. 8. The data read signal generating circuit 13 is constituted by a buffer selection determination circuit 131 and an address decoder 132. The address decoder 132 decodes a data destination address from the registers 111 to 114 and delivers a signal indicating the data destination. The buffer selection determination circuit 131 receives a buffer limit signal from the data destination, detects the buffers which hold data to be sent to data destinations not in the buffer limit state based on the output of the address decoder 132, discriminates the buffer which has the greatest data remainder amount from the above-detected buffers based on the data remainder amount signals from the buffers, and accordingly, determines to which buffer the data is to be transferred. Also, a selection signal is sent instructing the selection of the above-selected buffer.

The selected data delivery circuit 14 in the device of FIG. 6B receives the selection signal from the data read signal generating circuit 13, and selects one of the signals from the registers. The register 15 latches the output of the selected data delivery circuit 14. The data of the register 15 and the data effective signal of 4 lines is delivered as the output from the event transmission buffer 1. This data effective signal designates the buffer which is to receive the data in question from the four buffers.

This state of selection is locked until the data read signal generating circuit detects data partition information from the data being transferred, i.e., the data from the selected register. When such a lock is released, data including information of the data destination which is the top word of the data is latched in the registers 111 to 114 so that the device returns to the initial state. The circuit for detecting the data partition information can be obtained by combining simple logic circuits.

In the data read signal generating circuit 13 of FIG. 6B and FIG. 8, information of positions in the transmission network of the event transmission buffer 1 is received and preliminarily set therein. Hence, the data read signal generating circuit 13 receives the address of the data destination from the registers and determines to which four buffers of data destination the data in question is to be transmitted, based on the operation of the address decoder 132.

The manner of expression of the data destination address may be unique or not-unique. For example, when there are 64 processors and the data destination is expressed in 6 bits, the data destination is unique and only one line of the data effective signal lines is effective.

For example, when the data destination is expressed in 12 bits, a plurality of the destinations are expressed at once in a two-bit representation such as: "00"=0, "01"=1, "10"=1 or 0, "11"=1 or 0, with respect to each bit of a 6 bit address, a plurality of lines from the four data effective signal lines are simultaneously effective, and accordingly simultaneous transmissions to a plurality of buffers are possible. For example, a data destination "000000001001" corresponds to 6 bit addresses "000001" and "000011", and the data effective signal for these two data destination becomes effective. Also, various modifications of such address representation are possible.

Figure 9:
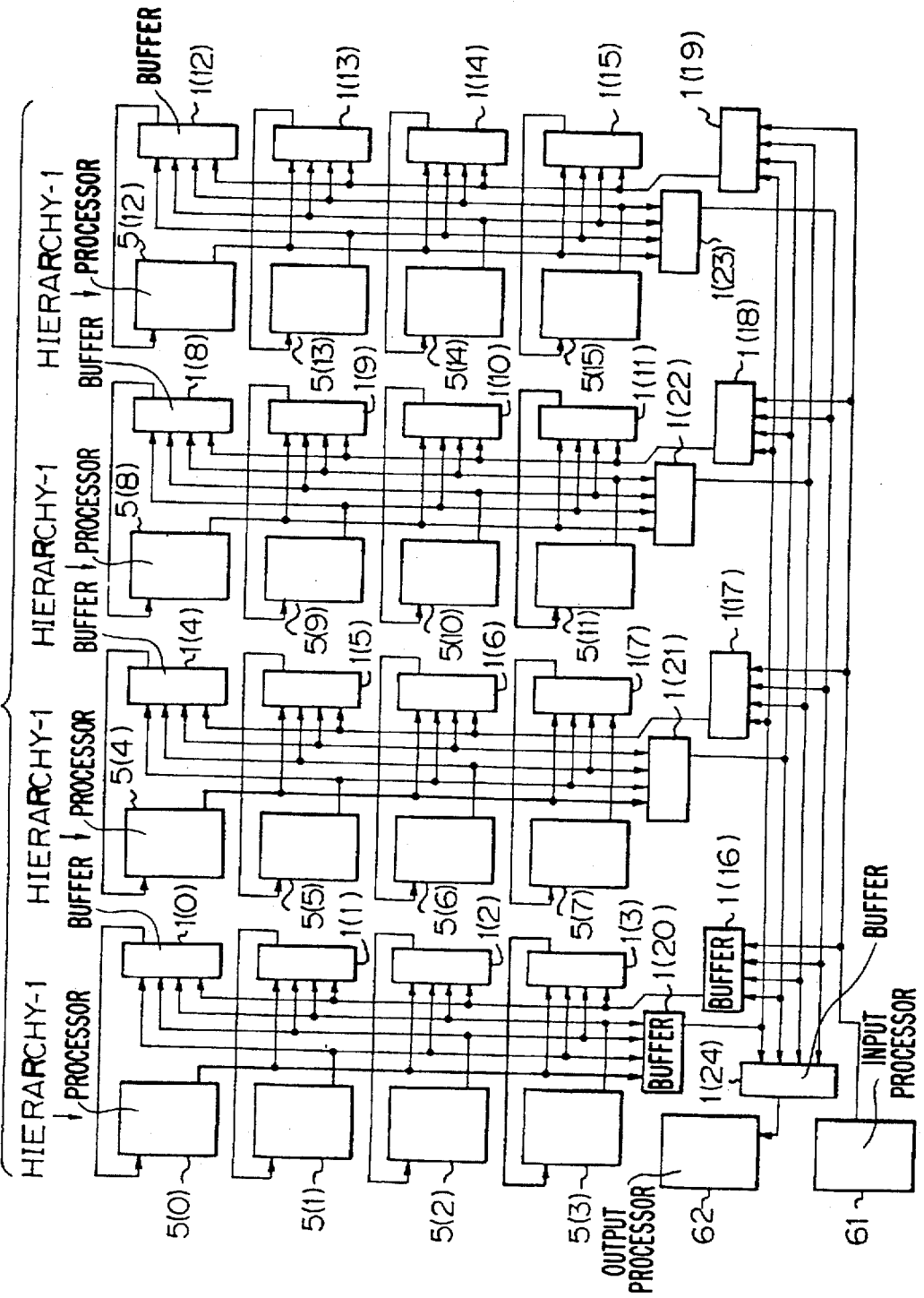
FIG. 9 shows an example of the structure of a simulation processor in which the data transferring buffer circuits for data exchange according to the present invention can be used.

An example of a multiprocessor system using an event transmission buffer of FIG. 6 is shown in FIG. 9. The system of FIG. 9 is constituted of processors 5(0), 5(1), . . . 5(15), event transmission buffers 1(0), 1(1), . . . 1(24), an input processor 61, and an output processor 62. The 16 processors are grouped into processor groups of 4 processors, and connected via event transmission buffers in a hierarchical manner.

The processors 5(0) to 5(3), 5(4) to 5(7), 5(8) to 5(11), and 5(12) to 5(15) constitute the processor groups of the first hierarchy. The entirety of processors 5(0) to 5(15) constitutes the processor group of the second hierarchy. The input processor 61 and the output processor 62 are connected to the upper device or other external device.

In the case where data is transmitted from the processor 5(0) to the processor 5(3), the processor 5(0) causes only the data effective signal corresponding to the event transmission buffer 1(3) among the four data effective signal lines to be effective and carries out transmission of data accordingly. Assuming that the input signal from the processor 5(0) is designated to the input terminal of the buffer 101 of the device of FIG. 6A, the data is received by the buffer 101. The received data is transmitted through the selection portion of the device of FIG. 6B to the processor 5(3).

In the case where data is transmitted from the processor 5(4) to the processor 5(11), the data is transmitted through the event transmission buffer 1(21), the event transmission buffer 1(18), and the event transmission buffer 1(11).

Figure 10:
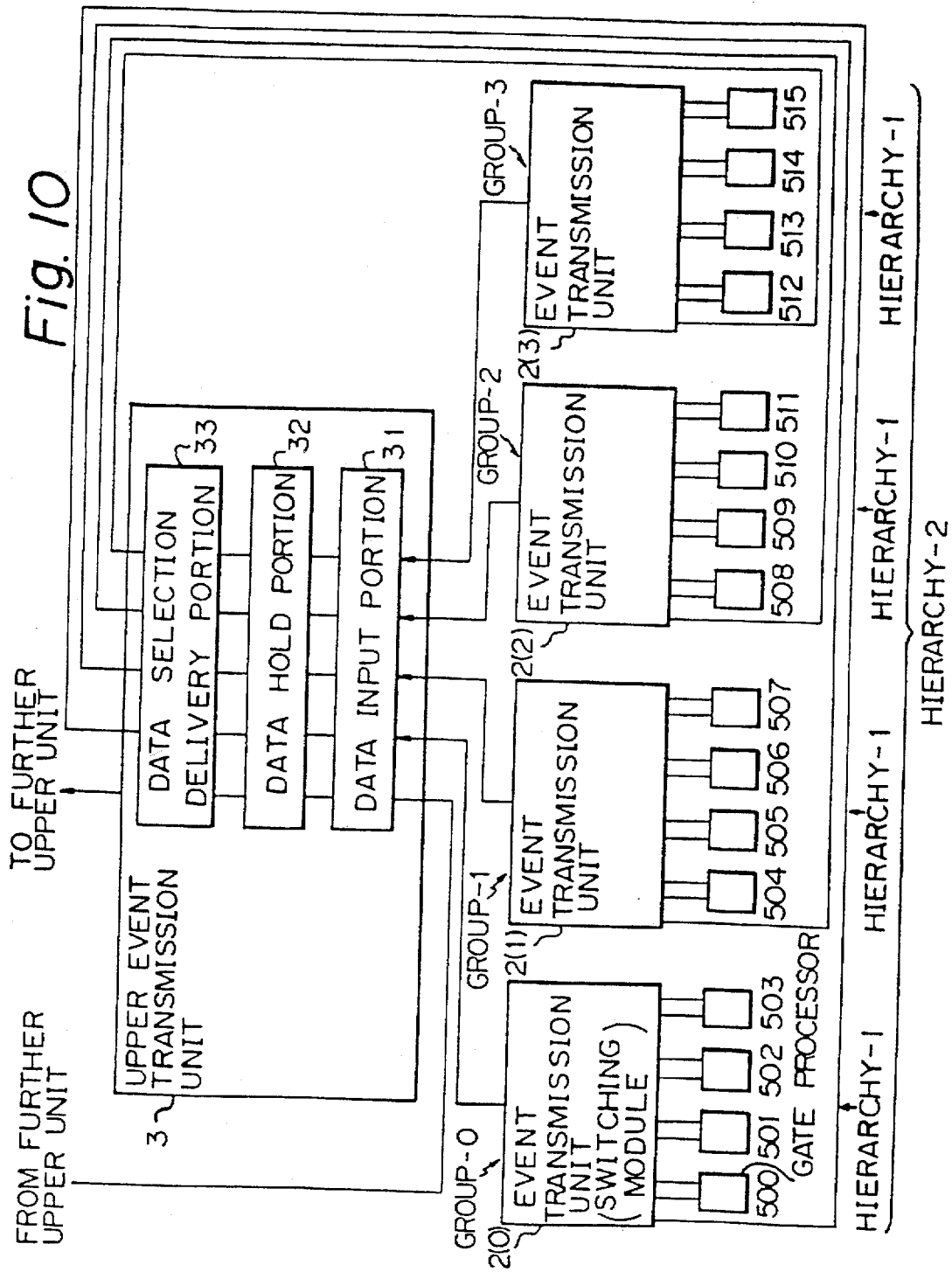
FIG. 10 shows a system of data transfer between a plurality of processors according to another embodiment of the present invention.
Figure 11:
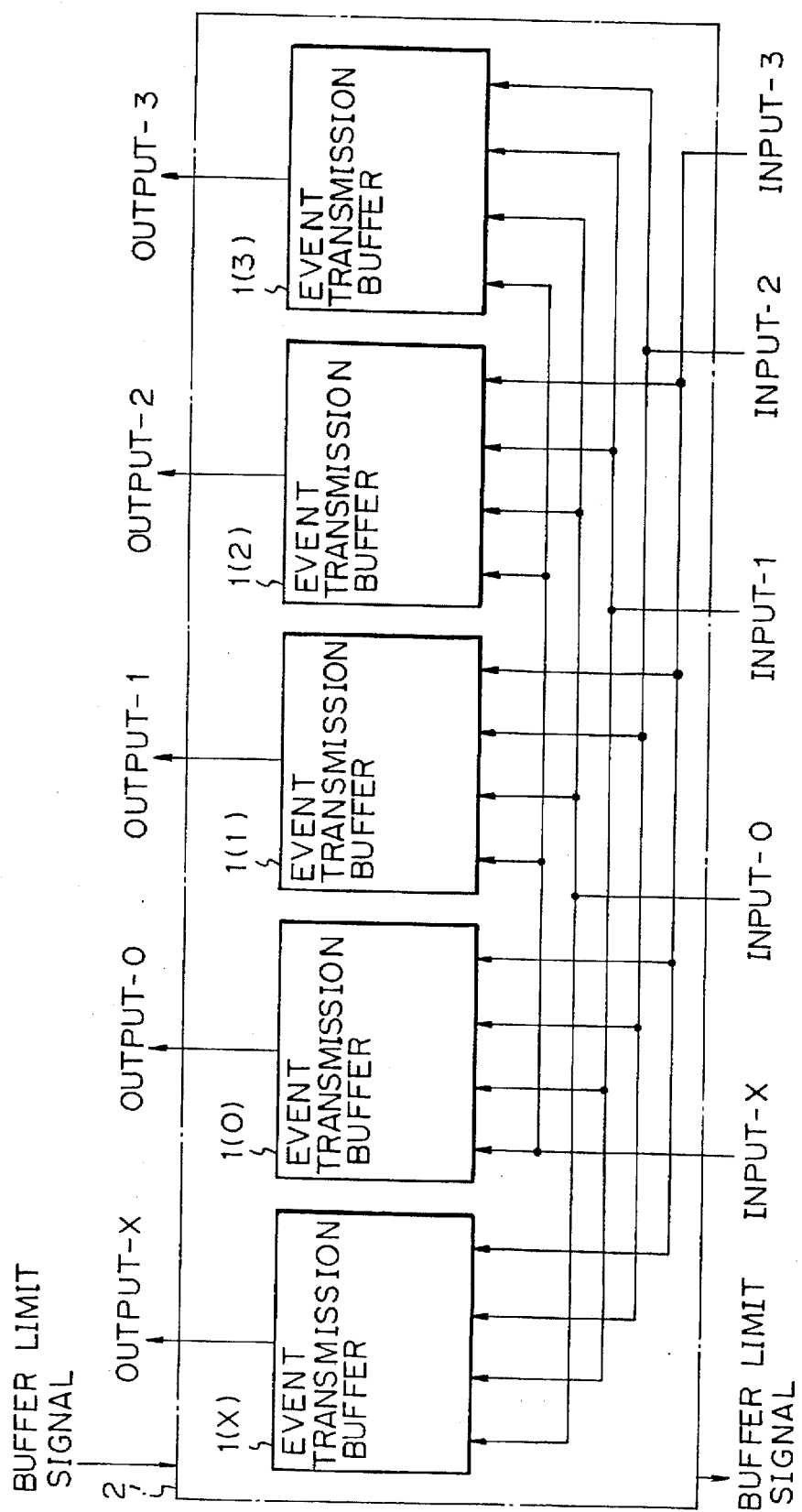
FIG. 11 shows the structure of an event transmission unit used in the system of data transfer shown in FIG. 10.

A system of data transfer between a plurality of processors according to another embodiment of the present invention is shown in FIG. 10. The structure of an event transmission unit used therein is shown in FIG. 11. The system of FIG. 10 includes a plurality of event transmission units 2(0), 2(1), 2(2) and 2(3) as a plurality of switching modules, a plurality of gate processors 500 to 515, and an upper event transmission unit 3. Each of the event transmission units and the upper event transmission unit is constituted by a data input portion or circuit 31, a data hold portion or circuit 32, and a data selection delivery portion or circuit 33.

The system of FIG. 10 is arranged in the hierarchical manner. The first event transmission unit 2(0) and the gate processors 500 to 503 constitute GROUP-0, the second event transmission unit 2(1) and the gate processors 504 to 507 constitute GROUP-1, the third event transmission unit 2(2) and the gate processors 508 to 511 constitute GROUP-2, and the fourth event transmission unit 2(3) and the gate processors 512 to 515 constitute GROUP-3. Each of the GROUP-0, GROUP-1, GROUP-2, and GROUP-3 belongs to the first hierarchy. The group constituted by the GROUP-0, GROUP-1, GROUP-2, and GROUP-3 belongs to the second hierarchy. It is possible to form a group of a higher level by assembling four groups of the same level, and it is possible that a processor will belong not to the lowest level group, i.e., the group of the first hierarchy, but to only the upper group.

The data input portion 31 receives the data from the processors in the same group i.e., another upper unit or the lower event transmission units 2(0)–2(3), and, if an upper group exists, the data from the upper group. The data hold portion 32 receives data from the data input portion 31 and holds the same until the data is delivered in succession to the data destination. The data selection delivery portion 33 selects and delivers the data held in the data hold portion 32 to the processors or the lower event transmission units 2(0)–2(3), and, if an upper group exists, to the upper group. The processors 500 to 515, and the event transmission units are connected through signal lines.

Where data is to be transmitted from the processor 500 to the processor 503, the processor 500 supplies the data to the event transmission unit 2(0), which transmits the data through a signal line to the processor 503. Where data is to be transmitted from the processor 504 to the processor 511, the processor supplies the data to the event transmission unit 2(1), which transmits the data via a signal line to the upper event transmission unit 3—which transmits the data via a signal line to the event transmission unit 2(2)—which transmits the data to the processor 511.

In each of the upper event transmission units, data from a data source is received by the data input portion and the received data is held in the data hold portion. A processor or an event transmission unit which instructs a data exchange can supply the data to be exchanged to an event transmission unit in question without being forced to switch to a waiting state, regardless of a data exchange by another processor or the like.

When a plurality of data exchange instructions simultaneously exist for an event transmission unit, to cause competition for a data destination, the data selection delivery portion transmits the data held in the data hold portion in succession, in correspondence with a data destination and in accordance with the selection in the data selection delivery portion. Therefore, it is not necessary to provide an exclusive control process or the like.

The structure of event transmission units 2(0)–2(3) used in the data transfer system of FIG. 10 is shown in FIG. 11. The event transmission unit 2 is constituted of a plurality of event transmission buffers 1(0), 1(1), 1(2), 1(3), and 1(X), and signal lines interconnecting the same.

The data from the lower elements in the same group is supplied through lines INPUT-0, INPUT-1, INPUT-2, and INPUT-3. The data from the upper device is supplied through a line INPUT-X. The data to the lower elements in the same group is delivered through lines OUTPUT-0, OUTPUT-1, OUTPUT-2, and OUTPUT-3. The data to the upper device is delivered through line OUTPUT-X. The data on one line includes, for example, n lines for data and 4 lines for data effective signals. The lines for data may include a parity bit.

Data input through input lines INPUT-0 to INPUT-3 and INPUT-X is received by the corresponding event transmission buffers 1(0) to 1(3), and 1(X), if one of the data effective signals is "1".

Figure 12:
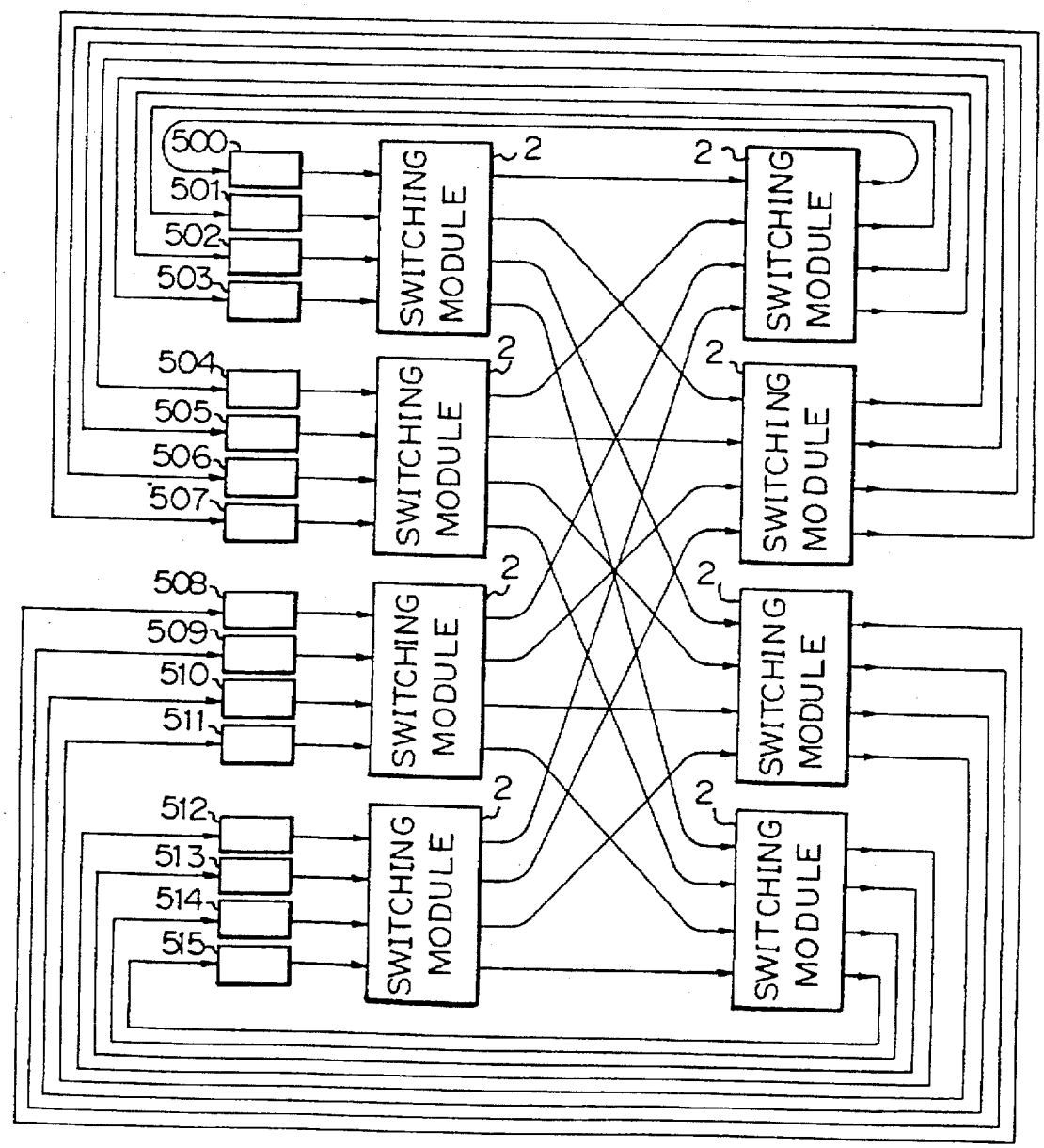
FIG. 12 shows an example of prior art multi-stage switching networks.

A comparison of the number of switching modules in the device of FIG. 10 as an embodiment of the present invention and that of a prior art multi-stage switching network shown in FIG. 12 is shown in FIG. 13. The number of the processors is N which is equal to the n-th power of 4. The number A of the switching modules required for the device of FIG. 10 is expressed as $A=\frac{1}{3}(N-1)$, and the number B of the switching modules required for the device of FIG. 12 is expressed as $B=\frac{1}{4}\cdot N\cdot\log_4 N$. As can be seen in FIG. 13, the ratio A/B is greatly reduced as the number N of the processors is increased. This shows the device of FIG. 10 can contribute to a reduction of the number of switching modules, and accordingly, to a simplification of the structure of the network.

I claim:

1. Data transferring buffer circuits for data exchange, said data transferring buffer circuits receiving data from a plurality of data sources, providing the data to a plurality of data destinations and receiving a destination buffer limit signal from at least one of the plurality of data destinations, said data transferring buffer circuits comprising:

a plurality of buffers connected to corresponding ones of the plurality of data sources to independently receive and store data in parallel the data sent from the plurality of data sources, each of said buffers providing a data remainder amount signal;

a buffer limit signal generating circuit, connected to said plurality of buffers, for generating a source buffer limit signal when an amount of data stored in one of said plurality of buffers reaches a predetermined limit and outputting the source buffer limit signal to one of a plurality of the data sources;

a data read signal generating circuit, connected to said plurality of buffers, for producing a selection signal to identify a selected buffer from among said plurality of buffers based on the data remainder amount signals from said plurality of buffers and the destination buffer limit signal from at least one of the plurality of data destinations indicating ability to receive the data from at least one of said buffers storing the data to be sent, and for supplying a data reading signal to the selected buffer; and a selected data delivery circuit, connected to said data read signal generating circuit and said buffers, for receiving the selection signal from said data read signal generating circuit and for delivering the data, output by the selected buffer in response to the data reading signal, to each of the at least one of the plurality of data destinations capable of receiving the data as indicated by the destination buffer limit signal received therefrom.

2. Data transferring buffer circuits according to claim 1, wherein the plurality of data sources and the plurality of data destinations are processors, and wherein said data transferring buffer circuits are connected to the processors for exchanging data between the processors.

3. Data transferring buffer circuits according to claim 1, wherein said data transferring buffer circuits receive a data effective signal from the one of the data sources corresponding to the selected buffer, and wherein each of said buffers comprises:

memory means for receiving and storing the data from the data source corresponding thereto;

a read address register, operatively connected to said memory means and said data read signal generating circuit, for counting the data reading signal from said data read signal generating circuit to produce a first count value;

a write address register, operatively connected to said memory means for counting the data effective signal to produce a second count value; and subtraction means, operatively connected to said read address register and said write address register, for subtracting the first count value from the second count value to produce the data remainder amount signal.

4. A system of data transfer between a plurality of processors in which data processing is carried out by exchanging data between each processor of the plurality of processors, said system comprising:

groups of processors and switching modules arranged in a hierarchical structure including higher levels and lower levels producing data exchange request signals and sending and receiving data simultaneously and selectively, a first communication between a first processor belonging to a first group of processors and switching modules of the higher levels and a second processor belonging to a second group of processors and switching modules of the lower levels and a second communication between third and fourth processors, each belonging to the second group of processors and switching modules of the lower levels, being carried out independently of each other and simultaneously with each other;

lower event transmission units, each having separate input and output connections directly to all of the processors in an associated lower level group of the processors and higher level input and output connections, to simultaneously receive the data exchange request signals from all of the processors in the associated lower level group and simultaneously output the data exchange request signals to at least one of the processors in the associated lower level group and the higher level output connection; and a first upper event transmission unit, connected to said lower event transmission units, for interconnecting said lower event transmission units, said first upper event transmission unit including:

a data input circuit, connected to each of said lower event transmission units, for receiving the data from the processors belonging to the lower levels;

a data holding circuit, connected to said data input circuit, for holding the received data from said data input circuit and providing the received data when a plurality of the data exchange request signals exist; and a selective data delivery circuit, connected to said data holding circuit, for receiving and selectively delivering the received data to one of the processors belonging to the lower levels via one of said lower event transmission units.

5. A system according to claim 4, wherein said system further comprises a second upper event transmission unit, connected to said first upper event transmission unit and said lower event transmission units, wherein said data input circuit further receives data from said second upper event transmission unit, and wherein said selective data delivery circuit further receives and delivers the received data to said second upper event transmission unit.

6. Event transmission buffer circuits for selectively transferring data between data sources and data destinations, each of said event transmission buffer circuits comprising:

internal buffer circuits provided for and connected to corresponding ones of the data sources, said internal buffer circuits receiving the data in parallel from the data sources, storing the data as stored data and generating a data remainder amount signal indicating an amount of stored data, each internal buffer circuit receiving, storing and generating independently of other internal buffer circuits;

a buffer limit signal generating circuit, connected to said internal buffer circuits, for generating and providing buffer limit signals when an amount of the data stored in one of said internal buffer circuits reaches a predetermined limit;

a data read signal generating circuit, connected to said internal buffer circuits, for selecting one of said internal buffer circuits in accordance with the data remainder amount signals from said internal buffer circuits and the buffer limit signals from another one of said event transmission buffer circuits, and for generating a data read signal for the one of said internal buffer circuits selected by said data read signal generating circuit; and a selected data delivery circuit, connected to said data read signal generating circuit, for receiving the stored data from the one of said internal buffer circuits and selectively providing the data, output by the one of said internal buffer circuits in response to the data read signal, to at least one of the data destinations.

7. Event transmission buffer circuits according to claim 6, wherein said event transmission buffer circuits receive a data effective signal from the one of the data sources corresponding to the internal buffer circuit selected, and wherein each of said internal buffer circuits comprises:
 memory means for receiving and storing the data from the data source corresponding thereto;
 a read address register, operatively connected to said memory means and said data read signal generating circuit, for counting the data read signal from said data read signal generating circuit to produce a first count value;
 a write address register, operatively connected to said memory means for counting the data effective signal to produce a second count value; and
 subtraction means, operatively connected to said read address register and said write address register, for subtracting the first count value from the second count value to produce the data remainder amount signal.

8. A data exchange unit for exchanging data among groups of processors, said data exchange unit provided for each group of processors, the groups of processors arranged in a lowest part of a hierarchical structure including upper data exchange units and lower data exchange units, and the processors generating data exchange request signals, said data exchange unit comprising:
 a data input circuit for simultaneously receiving data and a data exchange request signal from one to all of the processors of a same group and from one of the upper data exchange units, a first communication between a first processor belonging to the same group and a corresponding upper data exchange unit and a second communication between a second processor and a third processor, each belonging to the same group, are carried out independently of each other and simultaneously with each other;
 a data holding circuit, connected to said data input circuit, for receiving and holding the data from said data input circuit in accordance with the data exchange request signals; and
 a selective data delivery circuit, connected to said data holding circuit, for receiving the data held by said data holding circuit and selectively delivering the data to one or more of one of the processors belonging to the same group, one of the lower data exchange units, and one of the upper data exchange units.

9. A data transfer buffer system for transferring data between data sources and data destinations, said data transfer buffer system including data exchange units, each of said data exchange units comprising:
 buffer circuits, respectively connected to each of the data sources, for independently receiving and storing data in parallel;
 remainder signal means for generating data remainder signals indicating stored amounts of data in each of said buffer circuits;
 limit signal means for generating buffer limit signals when at least one of said buffer circuits stores a predetermined amount of data;
 selecting means for receiving said buffer limit signals from another of said data exchange units corresponding to at least one of the data destinations, for generating a selection signal identifying a selected one of said buffer circuits and generating a read signal for the selected one of said buffer circuits dependent upon said data remainder signals from said remainder signal means and said buffer limit signals from the other of said data exchange units; and
 selective data output means for receiving the selection signal and for receiving and selectively providing the stored data, corresponding to the selected one of said buffer circuits, as output data for at least one of the data destinations.

10. A system for data processing by hierarchically arranged processors exchanging data, said system comprising:
 processors, arranged in a hierarchical structure including at least one higher level and at least one lower level, to produce data exchange request signals, said processors in the at least one lower level formed in lower level groups with all lower level groups of said processors included in an upper level group of a next higher level;
 lower event transmission units, each having separate input and output connections directly to all of said processors in an associated lower level group of said processors and higher level input and output connections, to simultaneously receive the data exchange request signals from all of said processors in the associated lower level group and simultaneously output the data exchange request signals to at least one of said processors in the associated lower level group and the higher level output connection; and
 an upper event transmission unit to interconnect said lower event transmission units, said upper event transmission unit including
  a data input circuit, connected to the higher level output connection of each of said lower event transmission units, to receive the data exchange request signals from said lower level transmission units when the data exchange request signals are not directed from one of said processors to at least one other of said processors in a single lower level group;
  a data holding circuit, connected to said data input circuit, to hold a plurality of the data exchange request signals received by said data input circuit; and
  a selective data delivery circuit, connected to said data holding circuit and the higher level input connection of each of said lower event transmission units, to selectively deliver the data exchange request signals via said lower event transmission units to said processors in the at least one lower level.

* * * * *

UNITED STATES PATENT AND TRADEMARK OFFICE
CERTIFICATE OF CORRECTION

PATENT NO. : 5,740,468
DATED : Apr. 14, 1998
INVENTOR(S) : KARUBE et al.

It is certified that error appears in the above-identified patent and that said Letters Patent is hereby corrected as shown below:

TITLE PAGE: [75] Inventor, change "Machida" to --Tokyo--.

Col. 1, line 65, change "source," to --sources,--.

Signed and Sealed this

Twenty-fifth Day of August, 1998

Attest:

BRUCE LEHMAN

Attesting Officer     Commissioner of Patents and Trademarks